United States Patent

Pagariya et al.

(10) Patent No.: US 12,334,169 B2
(45) Date of Patent: Jun. 17, 2025

(54) SCHEME TO FETCH OPTIMAL READ PARAMETERS BY SKIPPING INVALID WORDLINES

(71) Applicant: WESTERN DIGITAL TECHNOLOGIES, INC., San Jose, CA (US)

(72) Inventors: Darshan Pagariya, Bangalore (IN); Vishal Sharma, Bangalore (IN)

(73) Assignee: SANDISK TECHNOLOGIES, INC, Milpitas, CA (US)

( * ) Notice: Subject to any disclaimer, the term of this patent is extended or adjusted under 35 U.S.C. 154(b) by 62 days.

(21) Appl. No.: 18/383,820

(22) Filed: Oct. 25, 2023

(65) Prior Publication Data

US 2025/0140331 A1    May 1, 2025

(51) Int. Cl.
 *G11C 29/12* (2006.01)
(52) U.S. Cl.
 CPC ............ *G11C 29/12005* (2013.01); *G11C 2029/1202* (2013.01)
(58) Field of Classification Search
 CPC ........... G11C 29/12005; G11C 2029/1202
 USPC ........................................ 714/719
 See application file for complete search history.

(56) References Cited

U.S. PATENT DOCUMENTS

| | | | |
|---|---|---|---|
| 10,475,523 B2 | 11/2019 | Sharon | |
| 10,580,485 B2 | 3/2020 | Avraham | |
| 11,200,959 B1 * | 12/2021 | Fitzpatrick | G11C 29/14 |
| 11,210,031 B1 | 12/2021 | Mekhanik | |
| 11,385,802 B2 | 7/2022 | Sharon | |
| 11,740,959 B2 * | 8/2023 | Xu | G06F 11/10 |
| | | | 714/6.1 |
| 2009/0222701 A1 * | 9/2009 | Song | G06F 11/1012 |
| | | | 714/704 |
| 2014/0219003 A1 * | 8/2014 | Ebsen | G11C 13/0004 |
| | | | 365/163 |
| 2014/0347936 A1 * | 11/2014 | Ghaly | G11C 29/04 |
| | | | 365/185.18 |
| 2015/0169398 A1 * | 6/2015 | Chunn | G06F 11/3034 |
| | | | 714/763 |
| 2016/0117216 A1 * | 4/2016 | Muchherla | G06F 11/30 |
| | | | 714/6.11 |
| 2022/0113894 A1 | 4/2022 | Avraham | |
| 2023/0134545 A1 | 5/2023 | Eliash | |

* cited by examiner

*Primary Examiner* — James C Kerveros
(74) *Attorney, Agent, or Firm* — Arlene P. Neal; Neal Blibo LLC

(57) ABSTRACT

A storage device updates optimal parameters associated with a Thermal Region Tag (TRT). A controller on the storage device assigns a TRT to blocks programmed at a given temperature range and updates an optimal TRT parameters by obtaining a set of representative wordlines and a set of indicative wordlines for a block assigned to the TRT. The controller performs a bit error rate (BER) estimation on indicative wordlines in the set until a valid indicative wordline is found. The controller determines whether a BER Estimation Scan (BES) check is to be performed when the valid indicative wordline is found. In performing the BES check, the controller performs the BER estimation on representative wordlines in the set until a valid representative wordline is found. When a valid representative wordline is found, the controller obtains the optimal TRT parameter and updates the optimal TRT parameter.

20 Claims, 5 Drawing Sheets

A

270 — IN PERFORMING THE BES CHECK, CONTROLLER 108 MAY READ A REPRESENTATIVE WORDLINE FROM THE SET OF REPRESENTATIVE WORDLINES AND PERFORM A BER ESTIMATION ON THE REPRESENTATIVE WORDLINE

280 — , CONTROLLER 108 MAY COMPARE A BER COUNT FOR THE REPRESENTATIVE WORDLINE TO THE EPWR THRESHOLD

290 — IF CONTROLLER DETERMINES THAT THE BER COUNT IS GREATER THAN THE EPWR THRESHOLD, CONTROLLER 108 MAY RETURN TO 270 UNTIL THERE ARE NO MORE REPRESENTATIVE WORDLINES LEFT IN THE SET TO BE READ AND CONTROLLER MAY MARK THE BLOCK AS AN OUTLIER BLOCK

2100 — IF CONTROLLER DETERMINES THAT THE BER COUNT IS LESS THAN THE EPWR THRESHOLD, CONTROLLER 108 MAY OBTAIN THE OPTIMAL TRT PARAMETERS FOR THE BLOCK BASED ON THE REPRESENTATIVE WORDLINE AND UPDATE THE PARAMETERS FOR THE TRT ASSOCIATED WITH A SET OF BLOCKS PROGRAMMED UNDER THE SAME TEMPERATURE CONDITION

END

FIG. 2 Continued

SCHEME TO FETCH OPTIMAL READ PARAMETERS BY SKIPPING INVALID WORDLINES

BACKGROUND

A storage device may be communicatively coupled to a host and to non-volatile memory including, for example, a NAND flash memory device on which the storage device may store data received from the host. The storage device may store data in blocks on the memory device. A group of memory blocks that are written at similar temperature ranges are expected to have similar stress and Bit Error Rate (BER) and may be marked with a thermal region tag (TRT). A BER check may be carried out on an indicative wordline selected from the block. The indicative wordline may represent the wordline with the highest flip-bit-count in the block.

A BER Estimation Scan (BES) check may also be carried out on a representative wordline selected from the block. The representative wordline may represent the block and may have, for example, the same number of shifts as the block. Based on the BES check, TRT parameters such as the optimal read voltage may be obtained and updated. When the storage device performs a host read using TRT parameters that are non-optimal, the host read may return high BER and decode failures, which may cause performance degradation and/or read timeouts. As such, the TRT parameters may require periodic refresh and fine tuning in order to fit changing conditions including, for example, temperature variance, potential data retention problems, etc.

In some instances, the indicative and/or representative wordlines that are selected to perform the BER and BES checks may be failure wordlines. When the TRT parameter from failure wordlines are used to perform the BER and BES checks, the storage device may mark the block as a TRT outlier block (i.e., a block that cannot be read with the TRT parameters). In one architecture, when a TRT outlier condition occurs, a TRT outlier handling operation is triggered wherein the data on the block may be relocated, which may cause performance degradation on the storage device. In another architecture, to prevent a TRT outlier condition from occurring, a list of invalid wordlines is maintained. The invalid wordlines are compared with indicative and/or representative wordlines from the block. A TRT outlier condition may occur if during the comparison, the indicative and/or representative wordlines are determined to be in the list of invalid wordlines. This architecture may require a firmware structure in the storage device for verifying the indicative and/or representative wordlines, which may increase the overhead of the storage device.

SUMMARY

In some implementations, the storage device may obtain and update an optimal parameter associated with a Thermal Region Tag (TRT) assigned to a group of blocks programmed at a given temperature range. The storage device includes a memory device including blocks to store data. A controller on the storage device may assign a TRT to blocks programmed at a given temperature range and update an optimal TRT parameter associated with the TRT by obtaining a set of representative wordlines and a set of indicative wordlines for a block assigned to the TRT. The controller performs a bit error rate (BER) estimation on indicative wordlines in the set until a valid indicative wordline is found. The controller determines whether a BER Estimation Scan (BES) check is to be performed when the valid indicative wordline is found. In performing the BES check, the controller performs the BER estimation on representative wordlines in the set until a valid representative wordline is found. When a valid representative wordline is found, the controller obtains the optimal TRT parameter and updates the optimal TRT parameter based on the representative wordline.

In some implementations, a method is provided for obtaining and updating an optimal parameter associated with a TRT assigned to a group of blocks programmed at a given temperature range. The method includes assigning a TRT to blocks programmed at a given temperature range and obtaining a set of representative wordlines and a set of indicative wordlines for a block assigned to the TRT. The method also includes performing a BER estimation on indicative wordlines in the set until a valid indicative wordline is found; and when a valid indicative wordline is found, determining whether a BES check is to be performed and performing the BER estimation on representative wordlines in the set until a valid representative wordline is found. The method further includes when the valid representative wordline is found, obtaining the optimal TRT parameter and updating the optimal TRT parameter based on the representative wordline.

In some implementations, a method is provided for obtaining and updating an optimal parameter associated with a TRT assigned to a group of blocks programmed at a given temperature range. The method includes assigning a TRT to blocks programmed at a given temperature range and obtaining a set of representative wordlines and a set of indicative wordlines for a block assigned to the TRT. The method also includes performing a BER estimation for an indicative wordline in the set of indicative wordlines and comparing a first BER count for the indicative wordline with a threshold until all indicative wordlines in the set of indicative wordlines are read or until the first BER count is less than the threshold. The method further includes determining that a BES check is to be performed when the first BER count is less than the threshold, performing the BER estimation for a representative wordline in the set of representative wordlines and comparing a second BER count for the representative wordline with the threshold until all representative wordlines in the set of representative wordlines are read or until the second BER count is less than the threshold. The method also includes when the second BER count is less than the threshold, obtaining the optimal TRT parameter and updating the optimal TRT parameter based on the representative wordline.

Figure 1:
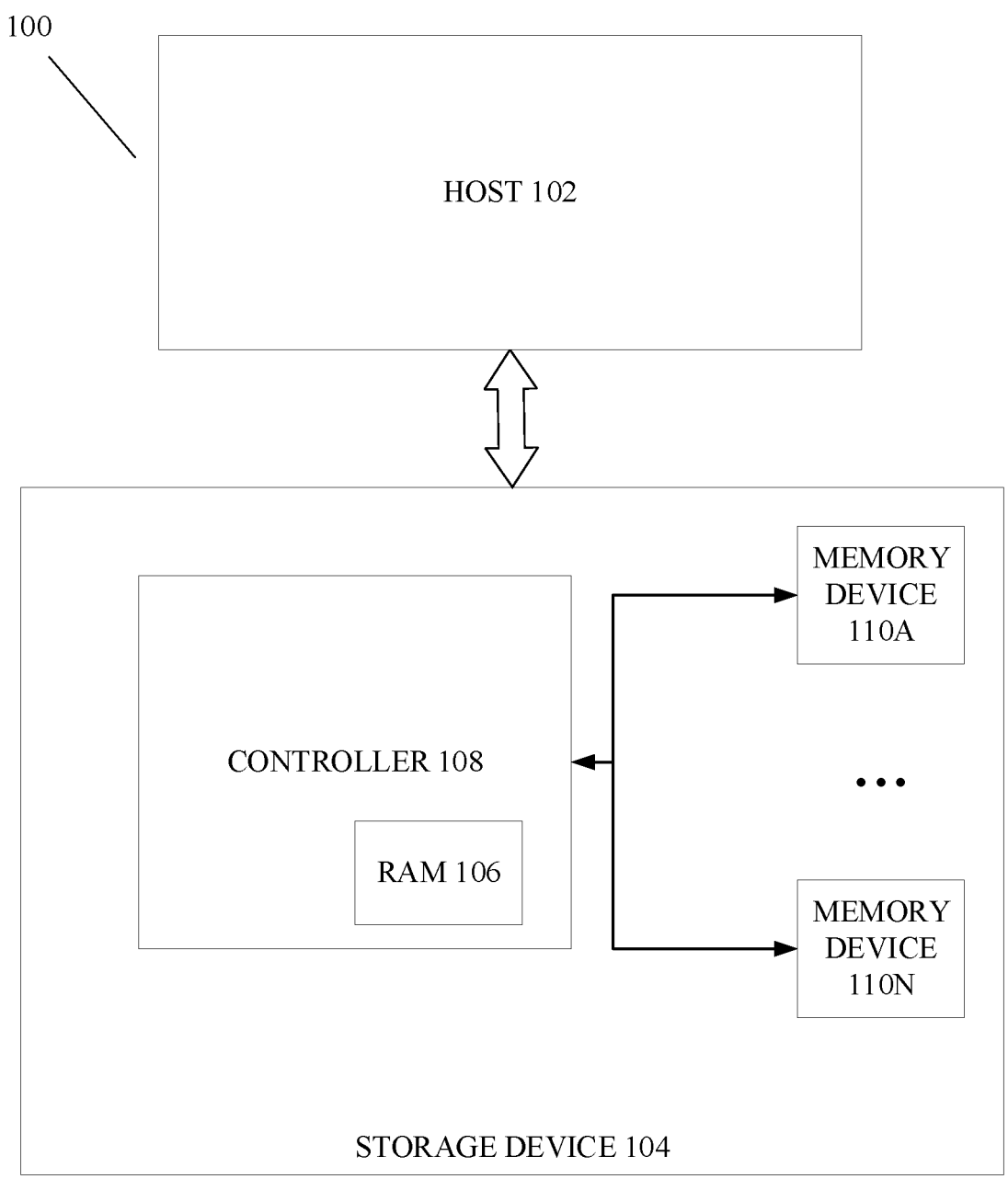
FIG. 1 is a schematic block diagram of an example system in accordance with some implementations.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations of the present disclosure.

The apparatus and method components have been represented where appropriate by conventional symbols in the drawings, showing those specific details that are pertinent to understanding the implementations of the present disclosure so as not to obscure the disclosure with details that will be readily apparent to those of ordinary skill in the art.

DETAILED DESCRIPTION OF THE INVENTION

The following detailed description of example implementations refers to the accompanying drawings. The same reference numbers in different drawings may identify the same or similar elements.

FIG. 1 is a schematic block diagram of an example system in accordance with some implementations. System 100 includes a host 102 and a storage device 104. Host 102 and storage device 104 may be in the same physical location as components on a single computing device or on different computing devices that are communicatively coupled. Storage device 104, in various embodiments, may be disposed in one or more different locations relative to the host 102. System 100 may include additional components (not shown in this figure for the sake of simplicity).

Storage device 104 may include a random-access memory (RAM) 106, a controller 108, and one or more non-volatile memory devices 110a-110n (referred to herein as the memory device(s) 110). Storage device 104 may be, for example, a solid-state drive (SSD), and the like. RAM 106 may be temporary storage such as a dynamic RAM (DRAM) that may be used to cache information in storage device 104.

Memory device 110 may be flash based. For example, memory device 110 may be a NAND flash memory that may be used for storing host and control data over the operational life of memory device 110. Memory device 110 may be included in storage device 104 or may be otherwise communicatively coupled to storage device 104. Memory device 110 may be divided into blocks, wherein when data is erased from memory device 110, the entire block of data may be erased. Blocks in memory device 110 may be grouped together into a plane, and a die may include a single plane full of data blocks or multiple planes that have been linked together. The number and configurations of planes within a flash die may be adaptable. A meta block may be formed in an interleaved manner, wherein the meta block may include a block from each plane in a die.

Controller 108 may interface with host 102 and process foreground operations including instructions transmitted from host 102. For example, controller 108 may read data from and/or write to memory device 110 based on instructions received from host 102. Controller 108 may further execute background operations to manage resources on memory device 110. For example, controller 108 may monitor memory device 110 and may execute garbage collection and other relocation functions per internal relocation algorithms to refresh and/or relocate the data on memory device 110.

To write host data to memory device 110, controller 108 may select a meta block to program. After programming, controller 108 may read the temperature when closing the meta block and allocate a Thermal Region Tag (TRT) to the block. For example, if after programming the meta block, controller 108 reads a 25 degrees Celsius (° C.) temperature and determines there is no current TRT associated with a range of temperatures including 25° C., controller 108 may create a new TRT for the 25° C. temperature and allocate the new TRT to the meta block. If controller 108 determines there is a current TRT associated with 25° C., controller 108 may assign the current TRT associated with 25° C. to the meta block. When controller 108 creates a new TRT and allocates the TRT to the meta block, controller 108 may update the optimal TRT parameters and use the optimal TRT parameters when performing subsequent host reads on the block.

To update the optimal TRT parameters for a new TRT, controller 108 may mark the TRT for a forced TRT update operation. Controller 108 may trigger the forced TRT update operation if, for example, controller 108 is unable to decode data on the block during a host read or if controller 108 creates a new TRT, allocates the TRT to a block, and marks the TRT for a forced TRT update operation. Controller 108 may also update the optimal parameters associated with a TRT during a periodic TRT update operation that may be performed after a predefined time period.

To update the TRT parameters, controller 108 may obtain a set of representative wordlines and a set of indicative wordlines for the block from firmware in storage device 104. The indicative wordlines may represent the worst wordlines with the highest flip-bit-count in the block. For example, storage device 104 may characterize a die by performing multiple program, read, and/or erase operations on the die and identifying which wordlines show the worst behavior. Storage device 104 may store a set of the wordlines in a block showing the worst behavior as the indicative wordlines for the block. Storage device 104 may also identify which wordlines represent the block. The wordlines representing the block may have, for example, the same number of shifts as the block. Storage device 104 may store a set of representative wordlines for the block.

Controller 108 may read an indicative wordline from the set of indicative wordlines to check the bit error rate (BER). Controller 108 may perform a BER estimation and obtain a BER count. The BER count obtained for an indicative wordline is referred to herein as a first BER count. Controller 108 may compare the first BER count for that indicative wordline to an Enhanced-Post-Write-Read (EPWR) threshold. The EPWR threshold may be a configurable threshold that may be stored in firmware in storage device 104. The EPWR threshold may be based, for example, on the number of read failures occurring on a die.

If the first BER count for an indicative wordline is greater than the EPWR threshold, controller 108 may select another indicative wordline from the set, read that indicative wordline, perform a BER estimation, obtain a first BER count for that indicative wordline, and compare the first BER count to the EPWR threshold. Controller 108 may repeat these steps until there are no more indicative wordlines left in the set of indicative wordline to be read or until the first BER count for an indicative wordline is less than the EPWR threshold. If controller 108 fails to read an indicative wordline with a first BER count that is less than the EPWR threshold and when there are no more wordlines left to be read in the set of indicative wordlines, controller 108 may determine that indicative wordlines in the set are invalid. Controller 108 may mark the block as an outlier block and perform outliner handling operations such as relocating data from the block.

If the first BER count for an indicative wordline from the set of indicative wordlines is less than the EPWR threshold, controller 108 may determine that the indicative wordline is a valid indicative wordline. Once controller 108 finds a valid indicative wordline, controller 108 may determine if a BER Estimation Scan (BES) check should be performed. When a TRT is created and allocated to the block, controller may perform the BES check to obtain the optimal TRT parameters from the representative wordline and to update the optimal TRT parameters. During subsequent periodic or forced TRT operations, controller 108 may obtain the current TRT parameters and determine if the current TRT parameters are optimal. If controller 108 determines that the current TRT parameters are not optimal TRT parameters, controller 108 may determine that the TRT parameters need to be updated and may perform the BES check.

For example, controller 108 may determine that the current read parameters need to be updated if controller 108 detects a read parameter deviation. Consider an example where controller 108 expects a 200 or less flip-bit-count when controller 108 is reading the block. If controller 108 detects, for example, a 150 flip-bit-count when reading the block, controller 108 may determine that there is no read parameter deviation and that the current TRT parameters may not need to be updated. If, on the other hand, controller 108 detects a 300 flip-bit-count when reading the block, controller 108 may detect a read parameter deviation. Based on the read parameter deviation, controller 108 may determine that the TRT read parameters need to be updated and that a BES check should be carried out.

In performing the BES check, controller 108 may read a representative wordline from a set of representative wordlines, perform a BER estimation and obtain a BER count. The BER count obtained for a representative wordline is referred to herein as a second BER count. Controller 108 may compare the second BER count to the EPWR threshold. If the second BER count is greater than the EPWR threshold, controller 108 may select another representative wordline from the set of representative wordlines, read that representative wordline, perform a BER estimation, obtain a second BER count for that representative wordline, and compare the second BER count to the EPWR threshold. Controller 108 may repeat these steps until there are no more representative wordlines left to be read from the set of representative wordlines or until the second BER count in a wordline is less than the EPWR threshold. If controller 108 fails to read a representative wordline with a second BER count that is less than the EPWR threshold and when there are no more wordlines in the set, controller 108 may determine that representative wordlines in the set are invalid. Controller 108 may mark the block as an outlier block and perform outliner handling operations.

When controller 108 reads a representative wordline with a second BER count that is less than the EPWR threshold, controller 108 may obtain the optimal TRT parameters including, for example, the optimal read voltage. Controller 108 may then update the optimal TRT parameters associated with a set of blocks programmed under the same temperature condition, Storage device 104 may thus reduce TRT update triggers and the respective TRT update handling. Storage device 104 may also avoid or reduce outlier detection and the associated outlier handling operations. For example, storage device 104 may not trigger an outlier handling operation based on processing a single faulty indicative or representative wordline. Storage device 104 also may not need to maintain a list of invalid wordlines.

Storage device 104 may perform these processes based on a processor, for example, controller 108 executing software instructions stored by a non-transitory computer-readable medium, such as storage component 110. As used herein, the term "computer-readable medium" refers to a non-transitory memory device. Software instructions may be read into storage component 110 from another computer-readable medium or from another device. When executed, software instructions stored in storage component 110 may cause controller 108 to perform one or more processes described herein. Additionally, or alternatively, hardware circuitry may be used in place of or in combination with software instructions to perform one or more processes described herein. Thus, implementations described herein are not limited to any specific combination of hardware circuitry and software. System 100 may include additional components (not shown in this figure for the sake of simplicity). FIG. 1 is provided as an example. Other examples may differ from what is described in FIG. 1.

Figure 2:
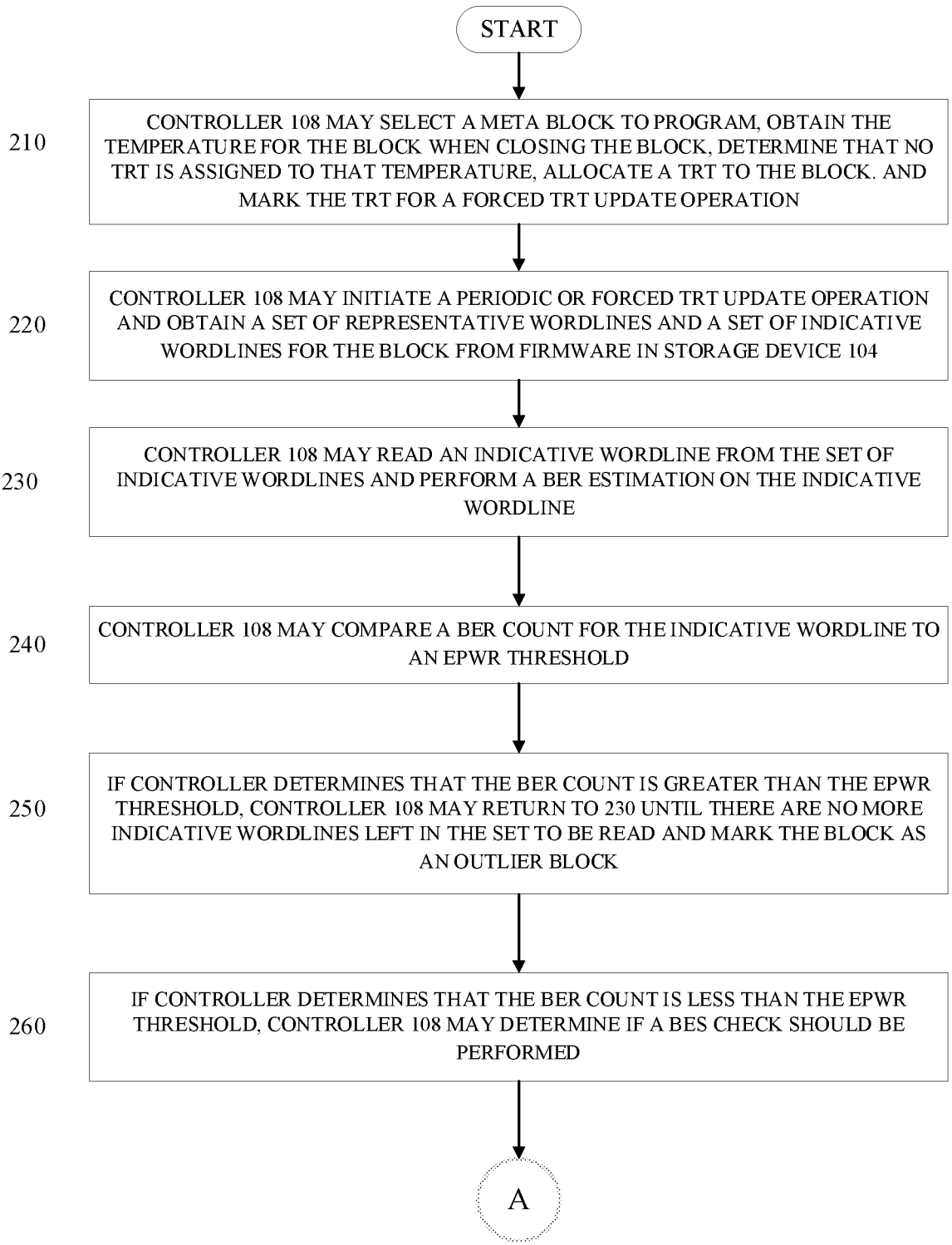
FIG. 2 is a flow diagram of an example process for fetching optimal read parameters associated with a Thermal Region Tag (TRT) by skipping invalid wordlines in accordance with some implementations.

FIG. 2 is a flow diagram of an example process for fetching optimal read parameters associated with a Thermal Region Tag (TRT) by skipping invalid wordlines in accordance with some implementations. At 210, controller 108 may select a meta block to program, obtain the temperature for the block when closing the block, determine that no TRT is assigned to that temperature, allocate a TRT to the block, and mark the TRT for a forced TRT update operation. At 220, controller 108 may initiate a periodic or forced TRT update operation and obtain a set of representative wordlines and a set of indicative wordlines for the block from firmware in storage device 104. At 230, controller 108 may read an indicative wordline from the set of indicative wordlines and perform a BER estimation on the indicative wordline. At 240, controller 108 may compare a BER count for the indicative wordline to an EPWR threshold. At 250, if controller determines that the BER count is greater than the EPWR threshold, controller 108 may return to 230 until there are no more indicative wordlines left in the set to be read and mark the block as an outlier block.

At 260, if controller determines that the BER count is less than the EPWR threshold, controller 108 may determine if a BES check should be performed. At 270, in performing the BES check, controller 108 may read a representative wordline from the set of representative wordlines and perform a BER estimation on the representative wordline. At 280, controller 108 may compare a BER count for the representative wordline to the EPWR threshold. At 290, if controller determines that the BER count is greater than the EPWR threshold, controller 108 may return to 270 until there are no more representative wordlines left in the set to be read and controller may mark the block as an outlier block. At 2100, if controller determines that the BER count is less than the EPWR threshold, controller 108 may obtain the optimal TRT parameters for the block based on the representative wordline and update the parameters for the TRT associated with a set of blocks programmed under the same temperature condition. As indicated above FIG. 2 is provided as an example. Other examples may differ from what is described in FIG. 2.

Figure 3:
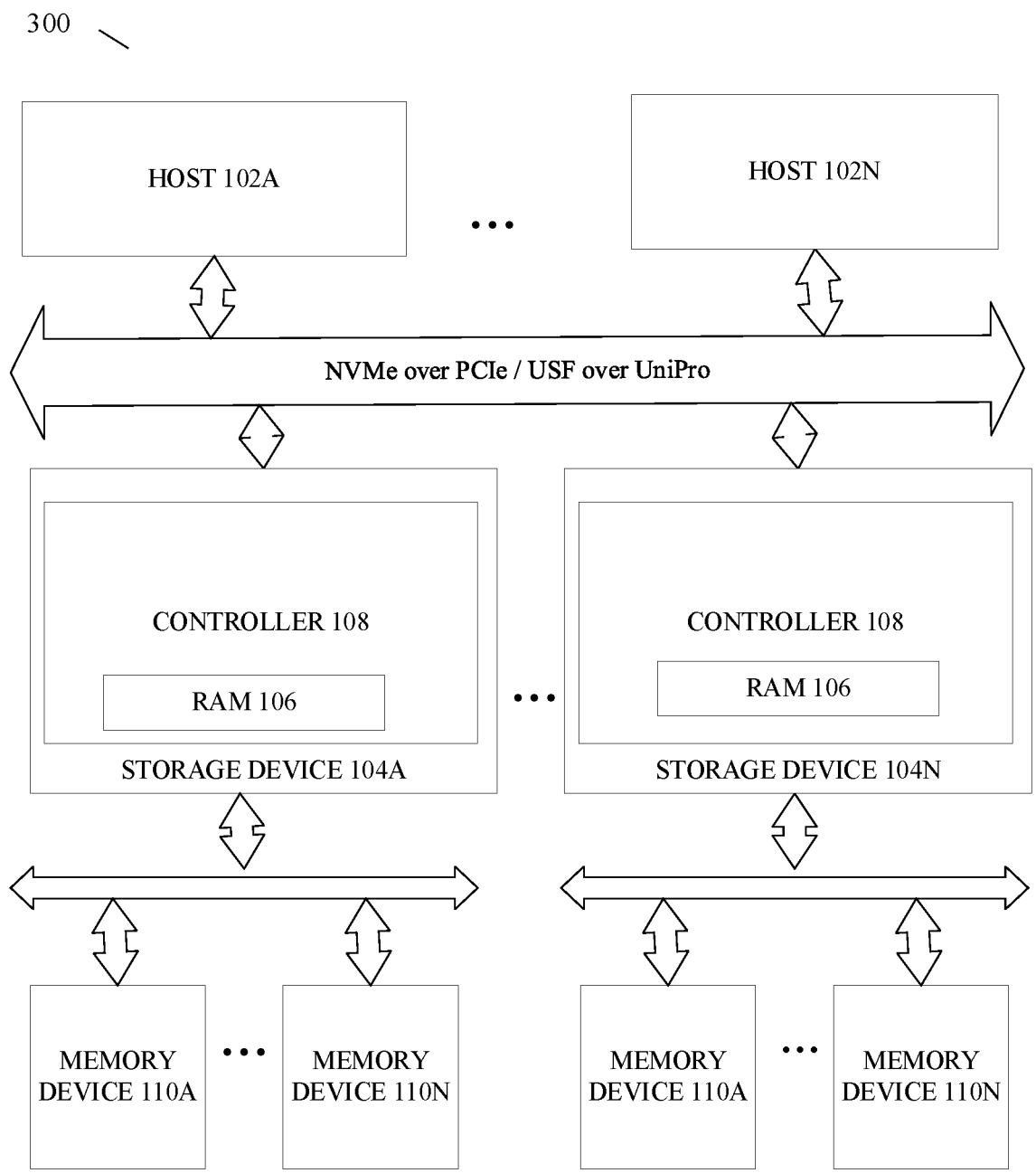
FIG. 3 is a diagram of an example environment in which systems and/or methods described herein are implemented.

FIG. 3 is a diagram of an example environment in which systems and/or methods described herein are implemented. As shown in FIG. 3, Environment 300 may include hosts 102-102*n* (referred to herein as host(s) 102), and storage devices 104*a*-104*n* (referred to herein as storage device(s) 104).

Storage device 104 may include a controller 108 to manage the resources on storage device 104. Controller 108 may fetch optimal read parameters for a group of blocks programmed under the same temperature condition while skipping invalid wordlines. Hosts 102 and storage devices 104 may communicate via Non-Volatile Memory Express (NVMe) over peripheral component interconnect express (PCI Express or PCIe) standard, the Universal Flash Storage (UFS) over Unipro, or the like.

Devices of Environment 300 may interconnect via wired connections, wireless connections, or a combination of wired and wireless connections. For example, the network of FIG. 3 may include a cellular network (e.g., a long-term evolution (LTE) network, a code division multiple access (CDMA) network, a 3G network, a 4G network, a 5G network, another type of next-generation network, and/or the like), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 3 are provided as an example. In practice, there may be additional devices and/or networks, fewer devices and/or networks, different devices and/or networks, or differently arranged devices and/or networks than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) of Environment 300 may perform one or more functions described as being performed by another set of devices of Environment 300.

Figure 4:
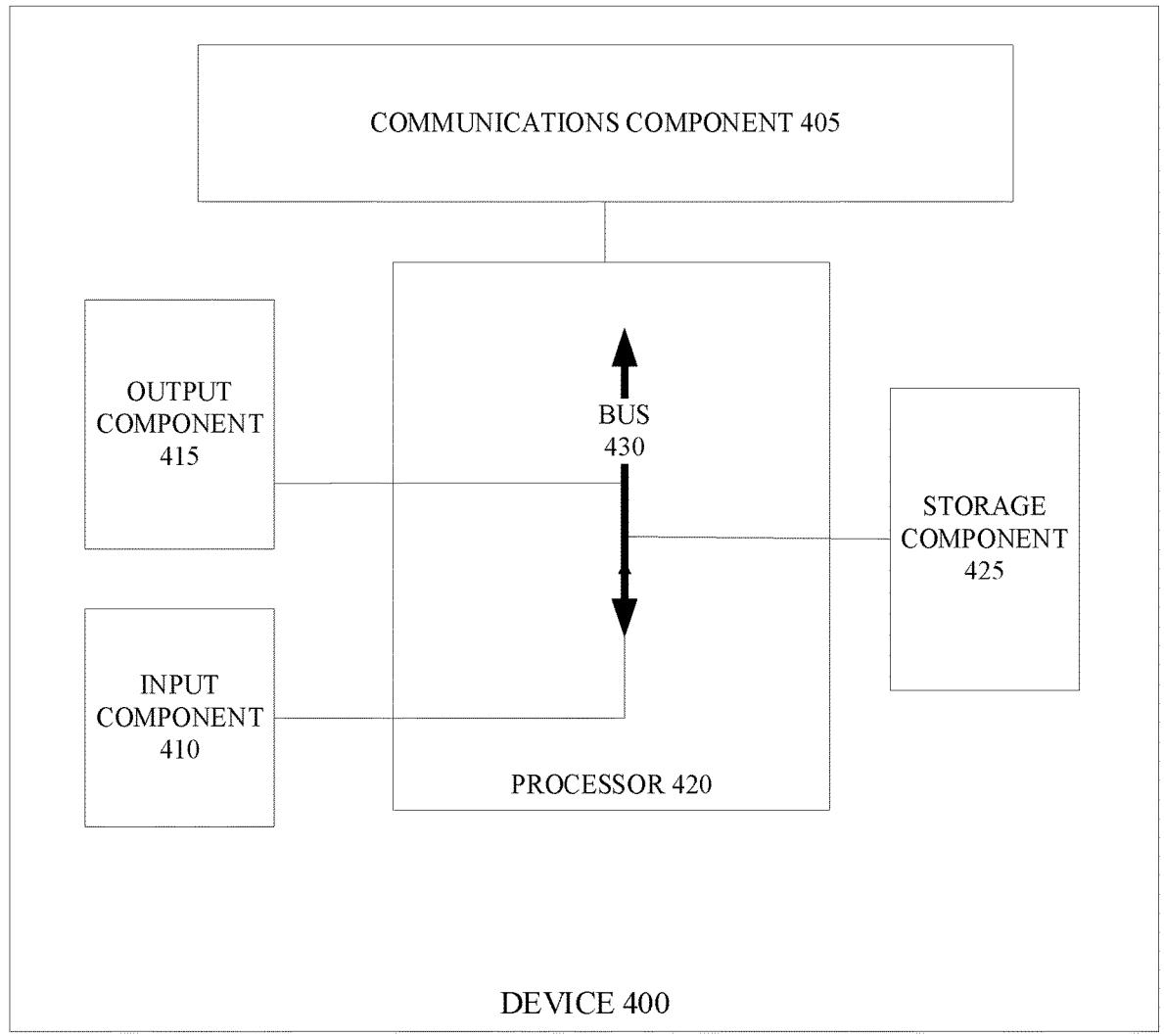
FIG. 4 is a diagram of example components of one or more devices of FIG. 1.

FIG. 4 is a diagram of example components of one or more devices of FIG. 1. In some implementations, host 102 may include one or more devices 400 and/or one or more components of device 400. Device 400 may include, for example, a communications component 405, an input component 410, an output component 415, a processor 420, a storage component 425, and a bus 430. Bus 430 may include components that enable communication among multiple components of device 400, wherein components of device 400 may be coupled to be in communication with other components of device 400 via bus 430.

Input component 410 may include components that permit device 400 to receive information via user input (e.g., keypad, a keyboard, a mouse, a pointing device, a microphone, and/or a display screen), and/or components that permit device 400 to determine the location or other sensor information (e.g., an accelerometer, a gyroscope, an actuator, another type of positional or environmental sensor). Output component 415 may include components that provide output information from device 400 (e.g., a speaker, display screen, and/or the like). Input component 410 and output component 415 may also be coupled to be in communication with processor 420.

Processor 420 may be a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 may include one or more processors capable of being programmed to perform a function. Processor 420 may be implemented in hardware, firmware, and/or a combination of hardware and software.

Storage component 425 may include one or more memory devices, such as random-access memory (RAM) 114, read-only memory (ROM), and/or another type of dynamic or static storage device (e.g., a flash memory, a magnetic memory, and/or optical memory) that stores information and/or instructions for use by processor 420. A memory device may include memory space within a single physical storage device or memory space spread across multiple physical storage devices. Storage component 425 may also store information and/or software related to the operation and use of device 400. For example, storage component 425 may include a hard disk (e.g., a magnetic disk, an optical disk, and/or a magneto-optic disk), a solid-state drive (SSD), a compact disc (CD), a digital versatile disc (DVD), a floppy disk, a cartridge, a magnetic tape, and/or another type of non-transitory computer-readable medium, along with a corresponding drive.

Communications component 405 may include a transceiver-like component that enables device 400 to communicate with other devices, such as via a wired connection, a wireless connection, or a combination of wired and wireless connections. The communications component 405 may permit device 400 to receive information from another device and/or provide information to another device. For example, communications component 405 may include an Ethernet interface, an optical interface, a coaxial interface, an infrared interface, a radio frequency (RF) interface, a universal serial bus (USB) interface, a Wi-Fi interface, and/or a cellular network interface that may be configurable to communicate with network components, and other user equipment within its communication range. Communications component 405 may also include one or more broadband and/or narrowband transceivers and/or other similar types of wireless transceiver configurable to communicate via a wireless network for infrastructure communications. Communications component 405 may also include one or more local area network or personal area network transceivers, such as a Wi-Fi transceiver or a Bluetooth transceiver.

Device 400 may perform one or more processes described herein. For example, device 400 may perform these processes based on processor 420 executing software instructions stored by a non-transitory computer-readable medium, such as storage component 425. As used herein, the term "computer-readable medium" refers to a non-transitory memory device. Software instructions may be read into storage component 425 from another computer-readable medium or from another device via communications component 405. When executed, software instructions stored in storage component 425 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

The foregoing disclosure provides illustrative and descriptive implementations but is not intended to be exhaustive or to limit the implementations to the precise form disclosed herein. One of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of present teachings.

As used herein, the term "component" is intended to be broadly construed as hardware, firmware, and/or a combination of hardware and software. It will be apparent that systems and/or methods described herein may be implemented in different forms of hardware, firmware, and/or a combination of hardware and software.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items (e.g., related items, unrelated items, a combination of related items, unrelated items, and/or the like), and may be used interchangeably with "one or more" The term "only one" or similar language is used where only one item is intended. Further, the phrase "based on" is intended to mean "based, at least in part, on" unless explicitly stated otherwise.

Moreover, in this document, relational terms such as first and second, top and bottom, and the like, may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", or "contains . . . a" does not, without more constraints, preclude the existence of additional identical elements in the process, method, article, or apparatus that comprises, has, includes, contains the element. The terms "substantially", "essentially", "approximately", "about" or any other version thereof, are defined as being close to as understood by one of ordinary skill in the art, and in one non-limiting implementation, the term is defined to be within 10%, in another implementation within 5%, in another implementation within 1% and in another implementation within 0.5%. The term "coupled" as used herein is defined as connected, although not necessarily directly and not necessarily mechanically. A device or structure that is "configured" in a certain way is configured in at least that way but may also be configured in ways that are not listed.

We claim:

1. A storage device to obtain and update an optimal parameter associated with a Thermal Region Tag (TRT) assigned to a group of blocks programmed at a given temperature range, the storage device comprises:

a memory device including blocks to store data; and
a controller to assign a TRT to blocks programmed at a given temperature range and update an optimal TRT parameter associated with the TRT by obtaining a set of representative wordlines and a set of indicative wordlines for a block assigned to the TRT, performing a bit error rate (BER) estimation on indicative wordlines in the set until a valid indicative wordline is found, determining whether to perform a BER Estimation Scan (BES) check when the valid indicative wordline is found, in performing the BES check, performing the BER estimation on representative wordlines in the set until a valid representative wordline is found, and when valid representative wordline is found, obtaining and updating the optimal TRT parameter based on the representative wordline.

2. The storage device of claim 1, wherein in performing the BER estimation on the indicative wordlines the controller performs the BER estimation for an indicative wordline in the set of indicative wordlines and compares a first BER count for the indicative wordline with a threshold until all indicative wordlines in the set of indicative wordlines are read or until the first BER count is less than the threshold.

3. The storage device of claim 2, wherein the controller determines whether the BES check is to be performed when the first BER count is less than the threshold.

4. The storage device of claim 2, wherein the controller marks the block as an outlier and performs outlier handling when the first BER count associated with each indicative wordline in the set of indicative wordlines is greater than the threshold.

5. The storage device of claim 1, wherein in performing the BER estimation on the representative wordlines the controller performs the BER estimation for a representative wordline in the set of representative wordlines and compares a second BER count for the representative wordline with a threshold until all representative wordlines in the set of representative wordlines are read or until the second BER count is less than the threshold.

6. The storage device of claim 5, wherein the controller marks the block as an outlier and performs outlier handling when the second BER count associated with each representative wordline in the set of representative wordlines is greater than the threshold.

7. The storage device of claim 1, wherein the controller marks a new TRT assigned to the block for a forced TRT update operation and the controller updates the optimal TRT parameter during the forced TRT update operation.

8. The storage device of claim 1, wherein the controller performs the BES check when a new TRT is created and allocated to the block.

9. The storage device of claim 1, wherein the controller performs the BES check when a current TRT parameter is not an optimal TRT parameter.

10. The storage device of claim 1, wherein the controller updates the optimal TRT parameter during a periodic TRT update operation.

11. A method on a storage device for obtaining and updating an optimal parameter associated with a Thermal Region Tag (TRT) assigned to a group of blocks programmed at a given temperature range, the storage device comprises a controller to perform the method comprising:

assigning a TRT to blocks programmed at a given temperature range;
obtaining a set of representative wordlines and a set of indicative wordlines for a block assigned to the TRT;

performing a bit error rate (BER) estimation on indicative wordlines in the set until a valid indicative wordline is found;

when a valid indicative wordline is found, determining whether to perform a BER Estimation Scan (BES) check and performing the BER estimation on representative wordlines in the set until a valid representative wordline is found; and when the valid representative wordline is found, obtaining the optimal TRT parameter and updating the optimal TRT parameter based on the representative wordline.

12. The method of claim 11, wherein the performing the BER estimation on the indicative wordlines comprises performing the BER estimation for an indicative wordline in the set of indicative wordlines and comparing a first BER count for the indicative wordline with a threshold until all indicative wordlines in the set of indicative wordlines are read or until the first BER count is less than the threshold.

13. The method of claim 12, further comprising determining that the BES check is to be performed when the first BER count is less than the threshold.

14. The method of claim 12, further comprising marking the block as an outlier and performing outlier handling when the first BER count associated with each indicative wordline in the set of indicative wordlines is greater than the threshold.

15. The method of claim 11, wherein the performing the BER estimation on the representative wordlines comprises performing the BER estimation for a representative wordline in the set of representative wordlines and comparing a second BER count for the representative wordline with a threshold until all representative wordlines in the set of representative wordlines are read or until the second BER count is less than the threshold.

16. The method of claim 15, further comprising marking the block as an outlier and performing outlier handling when the second BER count associated with each representative wordline in the set of representative wordlines is greater than the threshold.

17. The method of claim 11, further comprising marking a new TRT assigned to the block for a forced TRT update operation and updating the optimal TRT parameter during the forced TRT update operation and a periodic TRT update operation.

18. The method of claim 11, further comprising performing the BES check when a new TRT is created and allocated to the block.

19. The method of claim 11, further comprising performing the BES check when a current TRT parameter is not the optimal TRT parameter.

20. A method on a storage device for obtaining and updating an optimal parameter associated with a Thermal Region Tag (TRT) assigned to a group of blocks programmed at a given temperature range, the storage device comprises a controller to perform the method comprising:

assigning a TRT to blocks programmed at a given temperature range;

obtaining a set of representative wordlines and a set of indicative wordlines for a block assigned to the TRT;

performing a bit error rate (BER) estimation for an indicative wordline in the set of indicative wordlines and comparing a first BER count for the indicative wordline with a threshold until all indicative wordlines in the set of indicative wordlines are read or until the first BER count is less than the threshold;

determining whether to perform a BER Estimation Scan (BES) check when the first BER count is less than the threshold, performing the BER estimation for a representative wordline in the set of representative wordlines and comparing a second BER count for the representative wordline with the threshold until all representative wordlines in the set of representative wordlines are read or until the second BER count is less than the threshold; and when the second BER count is less than the threshold, obtaining the optimal TRT parameter and updating the optimal TRT parameter based on the representative wordline.

* * * * *